(12) United States Patent
Lee

(10) Patent No.: US 7,925,910 B2
(45) Date of Patent: Apr. 12, 2011

(54) SYSTEMS, METHODS AND DEVICES FOR LIMITING CURRENT CONSUMPTION UPON POWER-UP

(75) Inventor: June Lee, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 895 days.

(21) Appl. No.: 11/880,293

(22) Filed: Jul. 19, 2007

(65) Prior Publication Data
US 2009/0024856 A1    Jan. 22, 2009

(51) Int. Cl.
G06F 1/00    (2006.01)
(52) U.S. Cl. ...................................................... 713/322
(58) Field of Classification Search .................. 713/300, 713/330
See application file for complete search history.

(56) References Cited

U.S. PATENT DOCUMENTS

| | | | | |
|---|---|---|---|---|
| 3,879,647 | A | * | 4/1975 | Hamilton et al. ............. 363/16 |
| 5,258,662 | A | * | 11/1993 | Skovmand .................... 327/544 |
| 2004/0071036 | A1 | * | 4/2004 | Lee .............................. 365/226 |
| 2006/0034030 | A1 | * | 2/2006 | Andersen et al. ............ 361/118 |
| 2006/0108962 | A1 | * | 5/2006 | Murray et al. ................ 318/610 |

OTHER PUBLICATIONS

Actel, "Fusion Power Sequencing and Ramp-Rate Control", Sep. 2006.*

* cited by examiner

Primary Examiner — Thomas Lee
Assistant Examiner — Mohammed H Rehman
(74) Attorney, Agent, or Firm — Dorsey & Whitney LLP

(57) ABSTRACT

Embodiments are described including those for controlling peak current consumption of a multi-chip memory package during power-up. In one embodiment, each memory device of the multi-chip package includes a power level detector used to compare an internal voltage signal to a threshold. A current limiter controls the ramping rate of the internal voltage signal in response to the power level detector as the internal voltage signal ramps up towards the threshold.

17 Claims, 5 Drawing Sheets

SYSTEMS, METHODS AND DEVICES FOR LIMITING CURRENT CONSUMPTION UPON POWER-UP

TECHNICAL FIELD

Embodiments of the present invention relate generally to integrated memory devices, and more specifically, in one or more embodiments, to multi-chip semiconductor packages having distributed power-up sequencing.

BACKGROUND

Many electronic devices in a computer system need to be driven to an initial condition prior to turning on or resetting the computer system. An example of such an electronic device is a memory device. There are several types of memory devices, which are integrated circuit chips that may be packaged in a number of different ways. One type of memory is random access memory (RAM), memory that is typically used as main memory in the computer system. Most types of RAM memory are volatile, meaning that it requires a steady flow of electricity to maintain its contents. Therefore, the data stored in RAM is lost when the power is turned off. Another type of memory is FLASH memory, which is a type of non-volatile memory that retains the stored information even when the device is not powered. Each cell of the FLASH memory includes a floating gate field-effect transistor capable of holding a charge. The cells can be electrically programmed by charging the floating gate, and erased by removing the charge. The data in each memory cell is determined by the presence or absence of the charge in the floating gate. A typical memory device uses a variety of logic circuits such as latches, gates and flip-flops to support its operation. All of these logic circuits need to be driven to an initial condition, such as to a particular voltage during power-up in order for reliable operation of the device to occur.

Power-up generally refers to the ramping up of power from a nominal voltage (e.g., zero volts or some standby voltage) to a supply voltage. For an electronic device to begin proper operation, it should be properly powered-up. Power-up may occur at initial start-up of the device, but it may also occur sometime after initial start-up, such as after a dormant period where the power supplied to the device's internal circuits has been diminished to a standby level.

The device may include a means for generating an internal supply voltage that is regulated and independent of fluctuations in an external supply voltage. Having a reliable internal power source is necessary for achieving a proper power-up sequence, particularly in small portable devices, such as hand-held systems, for example, a hand-held flash memory-based digital camera. Typically during power up, the internal supply voltage is generated up to a level that is below the external supply voltage, one that is appropriate for properly operating the host device in a stabilized state without encountering the effects of voltage swings inherently found in the external supply voltage.

For a variety of reasons, a power level for active operation may be required during the power-up sequence, particularly in multi-chip packaging. For example, device parameters may need to be loaded in order to achieve optimized chip operation, or a power-on read may be required for system boot sequencing. During power-up the device typically draws current if the device is in active operation. In the case of multi-chip packaging, since each chip consumes current to be in active operation, executing chip initialization at the same time for all the devices in the package may result in too much consumption of power from the power supply. If each device that is initializing reaches peak current consumption at about the same time, the system may encounter a brown-out condition due to a sudden drop in the voltage of the power supply and one or more devices may power-up incorrectly. Consequently, errors may occur during chip operations, such as during boot-up, and prevent the system from operating as intended.

There is, therefore, a need for a computer system that reduces the consumption of peak current during power-up, particularly in the case of multi-chip packaging.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1:
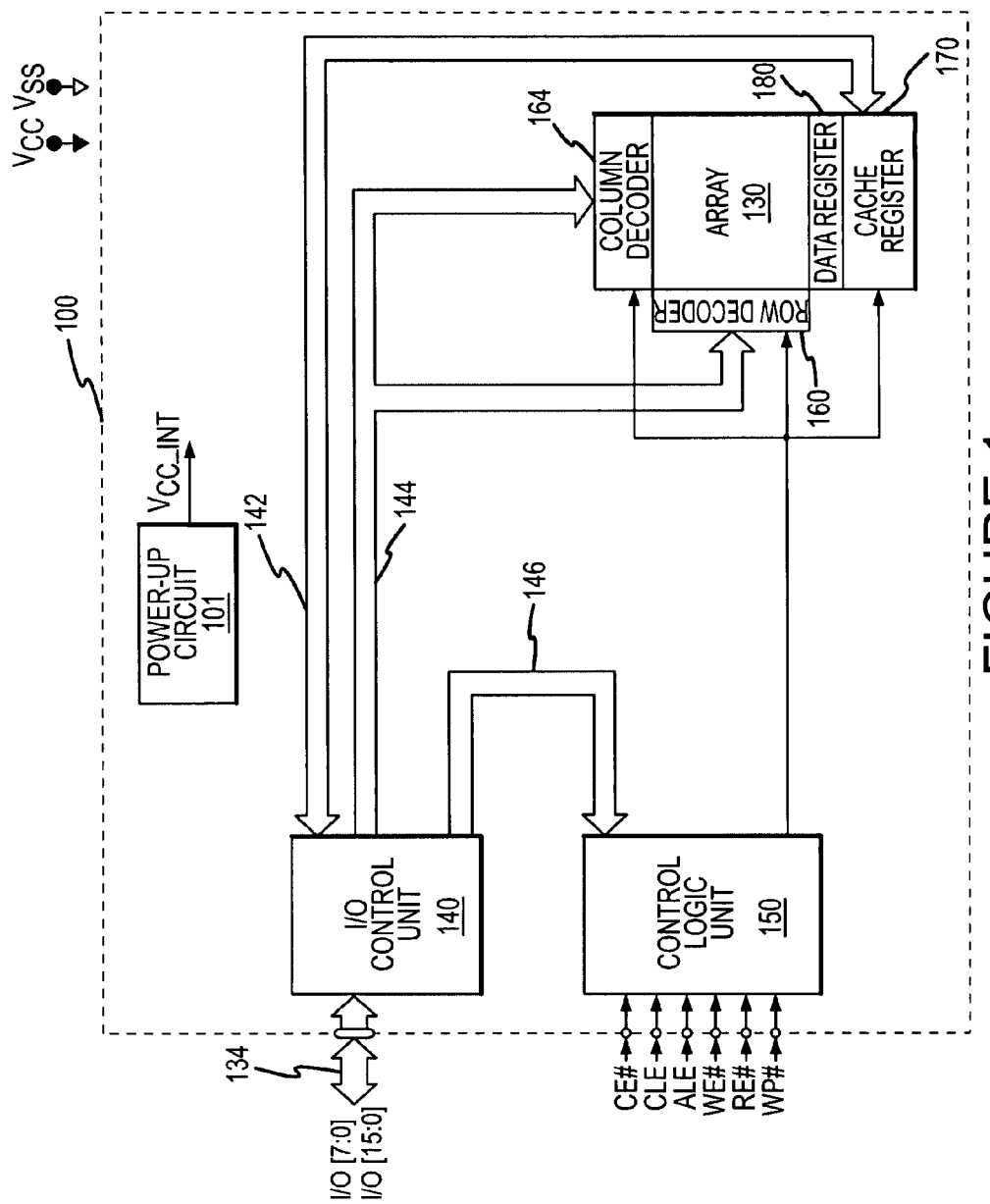
FIG. 1 is a block diagram a FLASH memory device having a power-up circuit according to an embodiment of the invention.

A flash memory device 100 that includes a power-up circuit 101 according to one embodiment of the invention is shown in FIG. 1. The flash memory device 100 includes an array 130 of flash memory cells arranged in banks of rows and columns. Most command signals, the address signals and the write data signals are applied to the memory device 100 as sets of sequential input/output ("I/O") signals transmitted through an I/O bus 134. Similarly, read data signals are output from the flash memory device 100 through the I/O bus 134. The I/O bus is connected to an I/O control unit 140 that routes the signals between the I/O bus 134 and an internal data bus 142, an internal address bus 144, and an internal command bus 146. The flash memory device 100 also includes a control logic unit 150 that receives a number of control signals either externally or through the command bus 146 to control the operation of the memory device 100. The address bus 144 applies row address signals to a row decoder 160 and column address signals to a column decoder 164. The row decoder 160 asserts word select lines corresponding to the decoded row address signals. Similarly, the column decoder 164 enables write data signals to be applied to bit lines for columns corresponding to the column address signals and allow read data signals to be coupled from bit lines for columns corresponding to the column address signals.

In response to the memory commands decoded by the control logic unit 150, the flash memory cells in the array 130 are erased, programmed, or read. The memory array 130 is programmed on a row-by-row or page-by-page basis. After the row address signals have been applied to the address bus 144, the I/O control unit 140 routes write data signals to a cache register 170. The write data signals are stored in the cache register 170 in successive sets each having a size corresponding to the width of the I/O bus 134. The cache register 170 sequentially stores the sets of write data signals for an entire row or page of flash memory cells in the array 130. All of the stored write data signals are then used to program a row or page of memory cells in the array 130 selected by the row address coupled through the address bus 144. In a similar manner, during a read operation, data signals from a row or page of memory cells selected by the row address coupled through the address bus 144 are stored in a data register 180. Sets of data signals corresponding in size to the width of the I/O bus 134 are then sequentially transferred through the I/O control unit 140 from the data register 180 to the I/O bus 134.

The power-up circuit 101 in the flash memory device 100 initiates power-up for the device 100 and generates an internal voltage for local device operations. The power-up circuit 101 also regulates the current being drawn by the device 100 to minimize the device 100 from reaching peak current consumptions. The power-up circuit 101 is now described in further detail.

Figure 2:
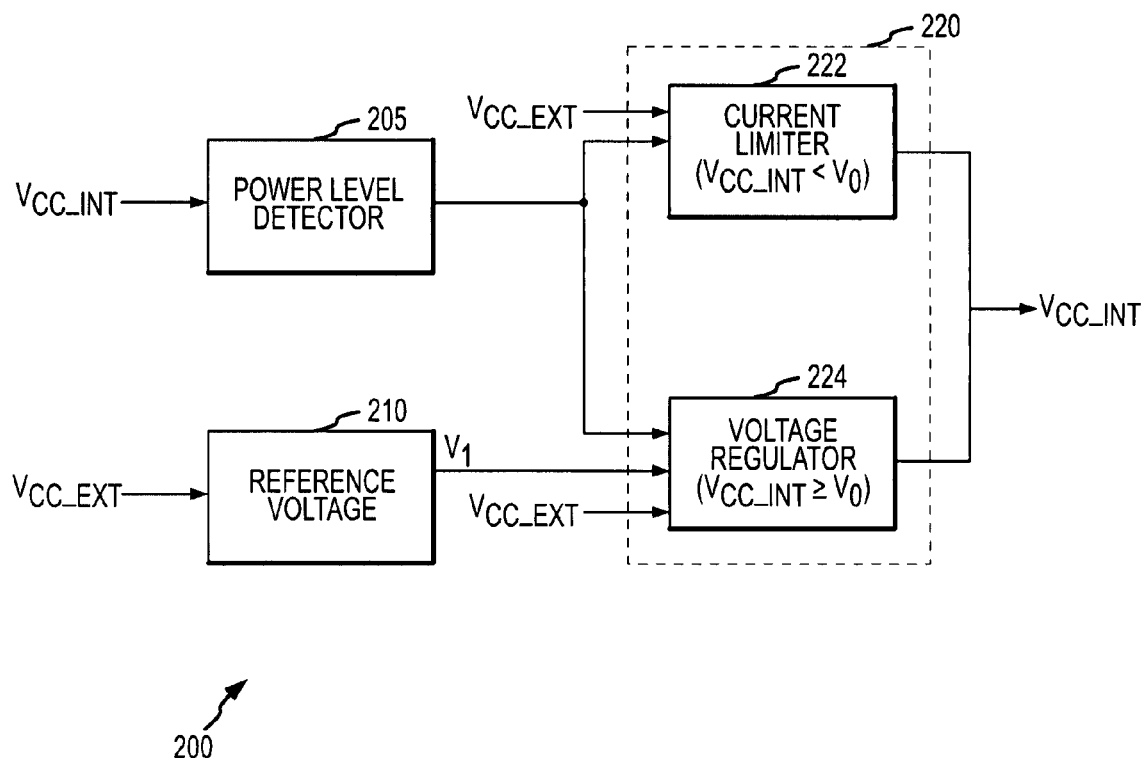
FIG. 2 is a detailed block diagram of the power-up circuit of FIG. 1 according to an embodiment of the invention.

FIG. 2 is a block diagram of a power-up circuit 200 having a power level detector 205, a reference voltage circuit 210, a current limiter 222, and a conventional voltage regulator circuit 224 according to an embodiment of the invention. As previously described, since the external supply voltage Vcc_EXT is often unreliable due to voltage swings, an internal supply voltage Vcc_INT may be generated to provide a substantially fixed voltage so that internal circuits of a host device (not shown) may be operated by relying on a stable voltage source. When a system is turned on by activating the external power supply (not shown), the external voltage Vcc_EXT begins to charge the Vcc_INT towards a voltage level $V_1$. One or more embodiments of the invention show ways to control the rate at which Vcc_INT charges towards $V_1$, thereby controlling the current consumption of the host device and avoiding peak current consumption levels.

In response to the reference voltage circuit 210 receiving the external voltage Vcc_EXT, the reference voltage circuit 210 determines the voltage level $V_1$ to which the Vcc_INT signal is charged towards. The reference voltage circuit 210 may be any reference circuit known in the art capable of providing a reference voltage to select a voltage level. Once the Vcc_INT signal is available, the power level detector circuit 205 receives and monitors the voltage level of the Vcc_INT as it ramps up towards $V_1$ and ensures the power-up operation of the host device is successfully achieved. The power level detector circuit 205 provides signals to either the current limiter 222 and/or the voltage regulator circuit 224, both of which are part of an internal voltage regulator block 220. The power level detector circuit 205 may be any circuit known in the art capable of detecting a signal level, such as a voltage divider, comparator, amplifier, and so on. The power level detector circuit 205 compares the Vcc_INT signal to a threshold level, such as a minimum voltage level $V_0$, and enables the current limiter 222 and/or the voltage regulator circuit 224 to control the "ramp-up rate" of the Vcc_INT signal (e.g., the rate at which Vcc_INT changes as it charges towards V1). The $V_0$ level represents the minimum voltage required during power-up for proper device operations. If Vcc_INT<$V_0$, the power level detector circuit 205 enables the current limiter 222 to control the ramp-up rate of the Vcc_INT signal such as to prevent the host device from reaching peak current consumption levels. If Vcc_INT≧$V_0$, the power level detector circuit 205 enables the voltage regulator circuit 224 to "speed up" (e.g, increase) the ramp-up rate of the Vcc_INT to $V_1$ and stabilize Vcc_INT level at $V_1$.

The current limiter 222 receives the voltage Vcc_EXT to ramp-up the Vcc_INT signal in a manner such that the device is prevented from drawing too much current too quickly, and thereby current peak out may be avoided during power-up. The current limiter 222 may be any circuit or device known in the art that allows for controlling either the voltage or current provided to ramp-up the Vcc_INT signal, and for achieving the desired ramp-up rate. For example, the current limiter 222 may be a circuit that can adjust the drive strength to generate current at a particular rate, or that may determine the rate at which voltage is supplied to reach a voltage level. The current limiter 222 may be configured a number of ways to implement the desired Vcc_INT ramp-up rate. The current limiter 222 may include one or more combinations of transistors, amplifiers, driver circuits, voltage/current regulators, and so on, that may be selectively enabled to generate the desired ramp-up rate of the Vcc_INT signal. For example, the current limiter 222 may be hardwired at the time of manufacture or preprogrammed by a controller (not shown) or system processor (also not shown) to program a particular ramping rate, the functionality of which will be further described in later sections.

When the Vcc_INT signal reaches $V_0$, the device has been stabilized at least to $V_0$ without peak current consumption, and the power level detector circuit 205 disables the current limiter 222 while enabling the voltage regulator circuit 224. Enabling the voltage regulator circuit 224 can also be used to the host device that the power-up operation has been properly achieved such that the host device can enable various device operations, such as initiating a boot-up sequence or loading and initializing device parameters for proper device operations, as previously described. Additionally, the voltage regulator circuit 224, ramps up the Vcc_INT signal to $V_1$ at a faster rate to complete the power-up operation, and, as is known in the art, stabilizes the Vcc_INT at $V_1$ during normal operation of the device. The voltage regulator circuit 224 may be constructed in a number of ways known in the art, and may include a single voltage regulator device or multiple voltage regulator devices.

In an alternative embodiment (not shown), the internal voltage regulator block 220 may include a voltage regulator circuit 224. The ramp-up rate of the Vcc_INT signal may instead be controlled by adjusting the transistor size of one or more of the voltage regulators in the voltage regulator circuit 224. The voltage regulator circuit 224 may be configured by selectively enabling circuit components that comprise the voltage regular circuit 224, either by hardwiring or by preprogramming the device. Thus, the drive strength of the voltage regulator circuit 224 instead of the current limiter 222 can be adjusted to control the amount of current being supplied as the Vcc_INT signal is ramped up. For example, a first group of voltage regulators in the voltage regulator circuit 224 having a first transistor size may be activated when Vcc_INT<$V_0$ to reduce the ramp-up rate of the Vcc_INT as it reaches $V_0$, and a second group of voltage regulators in the voltage regulator circuit 224 having a second transistor size may be activated when Vcc_INT≧V₀ for normal operation of the device.

Figure 3:
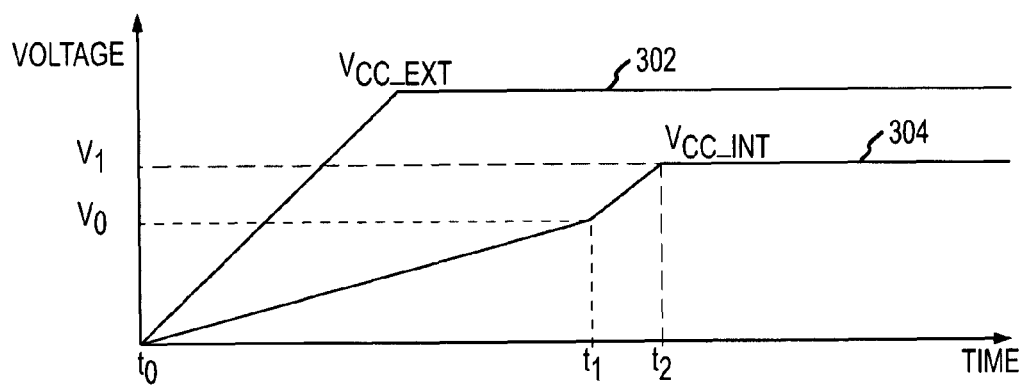
FIG. 3 is a timing diagram of various signals illustrating the operation of the power-up circuit of FIG. 2 according to an embodiment of the invention.

FIG. 3 shows various signals of a timing diagram that illustrate the operation of the power-up circuit 200 of FIG. 2. A Vcc_EXT signal 302 is shown ramping up when the host device is turned on. A Vcc_INT signal 304 is shown having a slope that is less than the slope of Vcc_EXT between times t0 and t1 due to the current limiter 222 of FIG. 2 controlling the ramp-up rate of the Vcc_INT signal. The Vcc_INT signal 304 also stabilizes at $V_1$, which is a voltage below the voltage of the Vcc_EXT signal, as described. Between times t0 to t1, the internal voltage Vcc_INT signal indicated by the signal 304 is less than $V_0$, and therefore the ramp-up rate is controlled by the current limiter 222, as previously described, to limit the current being consumed by the host device during power-up. Therefore, the slope of the Vcc_INT signal between t0 and t1 is less than the slope of Vcc_EXT signal represented by signal 302. Once Vcc_INT reaches the voltage level $V_0$, the current limiter 222 is disabled and the voltage regulator circuit 224 is enabled, causing the ramp-up rate to increase such that the Vcc_INT reaches the target $V_1$ faster.

Figure 4:
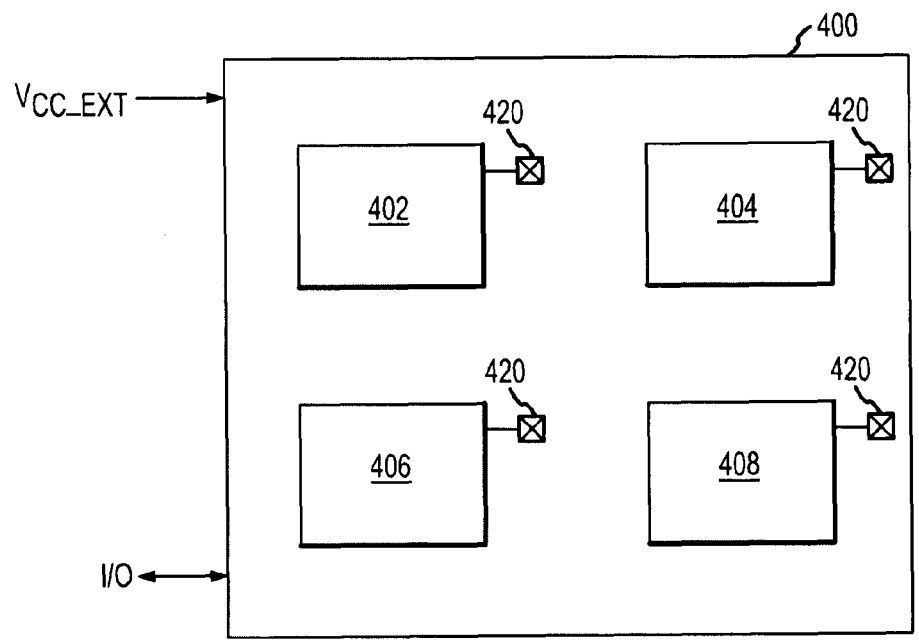
FIG. 4 is a block diagram of a multi-chip package including the power-up circuit of FIG. 2 according to another embodiment of the invention.

An example of a multi-device package, wherein each device includes the power-up circuit 200 of FIG. 2 is shown in FIG. 4 as a quad-die package (QDP) 400 having four memory devices 402-408. The QDP 400 is shown in simplified form, it being understood that multi-chip packages typically include a large number of other components, which have been omitted from FIG. 4 in the interests of brevity and clarity. The QDP 400 is coupled to receive the voltage Vcc_EXT from an external voltage supply to power all the devices 402-408. In the case of a flash memory device, the package 400 may include an I/O connection for receiving address and command signals, or for outputting data requested from one or more of the selected devices 402-408 to external circuitry. In the case of a DRAM memory device, the package 400 may instead include separate address and data pins (not shown) for receiving and transmitting signals or data, as known in the art. Each device 402-408 includes the power-up circuit 200 of FIG. 2 having the current limiter 222 that regulates current consumption during power-up, and the voltage regulator circuit 224 that stabilizes the Vcc_INT signal for local operations of the host device during normal operation. Each device 402-408 additionally includes a strap pad 420 to receive a multi-die selection data, or some other signal know in the art, that uniquely identifies each device 402-408. The strap pad 420 may be enabled, using logic controls known in the art, to receive the selection data, such as an address, for selecting or programming a particular host device 402-408 such that components of the host device 402-408 may be selectively enabled, for example components of the current limiter 222 and/or the voltage regulator circuit 224, to generate the Vcc_INT signal at a ramp-up rate unique to each device 402-408 during power-up. An example of addresses provided to the strap pad 420 may be the assignments "00" to select the device 402, "01" to select the device 404, "10" to select the device 406, and so on. When the device 402 receives the selection data "00", the device 402 is programmed according to the configuration associated with the selection data "00", which may be different from the configuration associated with the selection data "01", "10" or "11". It will be understood that, the QDP 400 is not intended to limit the invention to the particular embodiment. Those ordinarily skilled in the art will appreciate that the number of devices in a package and the means for selecting each device 402-408 using the strap pad 420 are details that can be modified without departing from the scope of the embodiments of the invention.

Since each device 402-408 may be individually identified by its strap pad 420 receiving a unique selection data, and since the parameters for each device 402-408 may be independently configured (e.g., via programming), each device 402-408 may be assigned to have a different ramp-up rate in a manner that causes the Vcc_INT signal to reach $V_1$ at different times. By varying the ramp up rates of the Vcc_INT signals, the current being drawn by each device 402-408 may be individually controlled to ensure that each individual device 402-408 does not reach peak current consumption, or that the devices 402-408 do not draw the same amount of current at the same time, which may cause overconsumption of the total current and lead to a brown-out condition. Upon power-up, the different ramp-up rates allow the Vcc_INT signal of each device 402-408 to reach $V_1$ at different instances, thereby allowing the devices 402-408 to sequentially complete their power-up operation.

Figure 5:
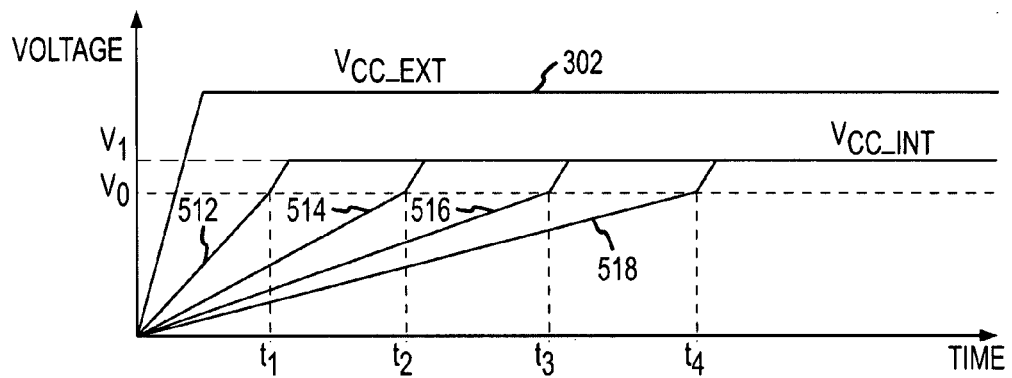
FIG. 5 is a timing diagram of various signals illustrating the operation of the multi-chip package of FIG. 4 according to another embodiment of the invention.

The power-up operation of each device 402-408 in the QDP 400 of FIG. 4 is illustrated by the various signals shown in the timing diagram of FIG. 5. Similar to FIG. 3, the Vcc_EXT signal 302 ramps up at a normal rate as the QDP 400 is turned on by an external power source. However, in contrast, four Vcc_INT signals 512-518 are shown corresponding to each of the devices 402-408, each signal having a different slope as each respectively charges towards V0, wherein the Vcc_INT signals 512-518 reach $V_1$ at different times t1-t4. As a result, as each signal 512-518 reaches the minimum voltage level $V_0$, the host device 402-408 may initiate local circuit operations as previously described, at different times between t1 and t4 respectively. Therefore, current consumption of multiple devices in a package 400 may be distributed during sequentially powering-up each device 402-408 to prevent peak current consumption of each device 402-408 from occurring, and consequently avoid a brown-out condition from occurring in the overall system.

Figure 6:
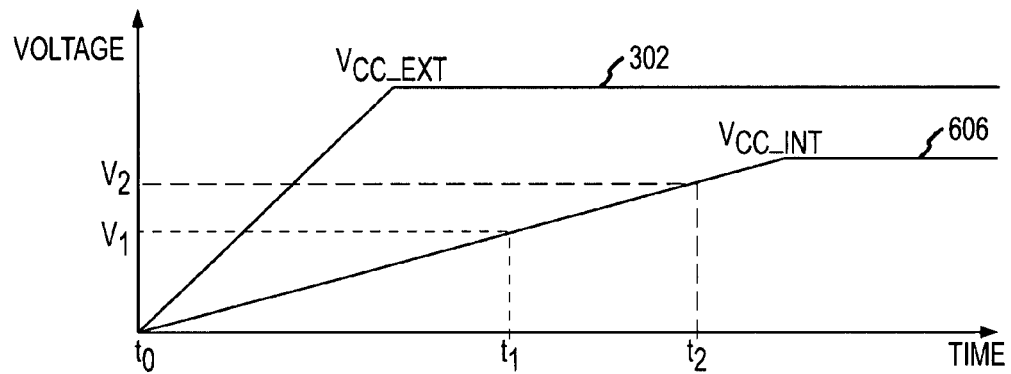
FIG. 6 is a timing diagram of various signals illustrating the operation of a multi-chip package according to another embodiment of the invention.

The signal diagram of FIG. 6 illustrates the operation of an alternative embodiment for a power-up sequence in a dual-die package (DDP) (not shown). It will be appreciated that those ordinarily skilled in the art will obtain sufficient understanding from the description provided herein to combine the functionality of the above embodiments, or to make modifications as needed to practice embodiments of the present invention without departing from the scope of the present invention. For example, as shown by the signal diagram of FIG. 6, the power level detector circuit 205 may be configured to detect either a $V_1$ level for the power-up operation of the first device at a time t1, and a $V_2$ level for the power-up operation of the second device at a time t2. The current limiter 222 may be programmed to provide a Vcc_INT signal 606 having a much slower ramp-up rate than previously shown in FIG. 3 to provide a sufficient time difference between times t1 and t2. Alternatively, in the case of the DDP, where the package includes only two devices, the above embodiments may be combined to produce two Vcc_INT signals (not shown) having two different ramping rates, delineating two power-up sequences.

In summary, by regulating current drawn by the host device during power-up, peak current consumption may be avoided to allow for optimized device operations and to reduce errors that may occur due to improper power-up. Localizing the control of current consumption at the device level also allows for each device, as in the example of the multi-chip package, to ramp up at different rates. Therefore each device completes power-up at different times or in sequence, and may start initialization or the boot-up sequence at different times. As a result, the multi-chip package avoids consuming large amounts of current, which may prevent the overall system from encountering a brown-out condition.

Figure 7:
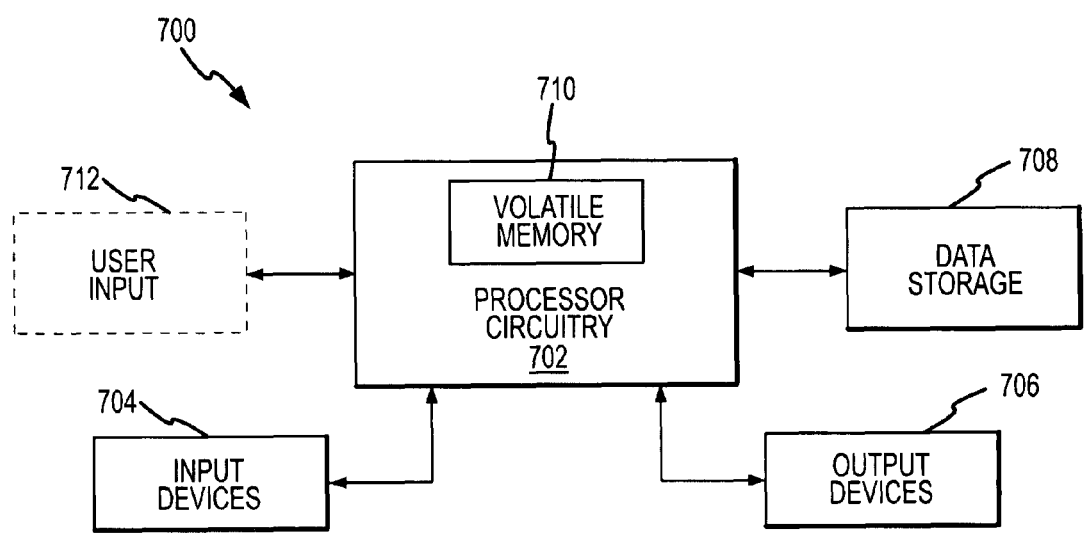
FIG. 7 is a block diagram of a processor-based system that includes at least one memory device having the power-up circuit according to embodiments of the invention.

FIG. 7 is a block diagram of an embodiment of a processor-based system 700 that includes a multi-chip memory package, such as the QDP 400 of FIG. 4, in accordance with embodiments of the invention. Conventionally, the processor circuitry 702 is coupled through address, data, and control buses to a volatile memory device 710 to provide for writing data to and reading data from the volatile memory device 710. The processor circuitry 702 includes circuitry for performing various processing functions, such as executing specific software to perform specific calculations or tasks. In addition, the processor-based system 700 may include one or more input devices 704, such as a keyboard or a mouse, coupled to the processor circuitry 702 to allow an operator to interface with the processor-based system 700. Typically, the processor-based system 700 may also include one or more output devices 706 coupled to the processor circuitry 702, such as output devices typically including a printer and a video terminal. One or more data storage devices 708 are also typically coupled to the processor-based circuitry 702 to store data or retrieve data from external storage media (not shown). Examples of typical storage devices 708 include hard and floppy disks, tape cassettes, compact disk read-only ("CD-ROMs") and compact disk read-write ("CD-RW") memories, and digital video disks ("DVDs"). Data storage devices 708 may also include devices to store data that is to be retained even when power is not supplied to the processor-based system 700 or the data storage devices 708, such as a flash memory device (not shown) according to some other examples of the invention. Flash memory, like volatile memory, may be packaged in a variety of ways, that additionally include one or more of the embodiments described above.

FIG. 7 may alternatively be a block diagram of a consumer device, such as a cell phone, digital camera or other hand-held device, having a user input 712 coupled to the processor 702. The processor 702 may be a microprocessor, digital signal processor, or part of a central processing unit that communicates with the user input 712 over a bus. The processor 702 may additionally have a random access memory (RAM) or, alternatively, the user input 712 may include the RAM to which the processor communicates over the bus. The user input 712 may additionally include a non-volatile storage device such as flash memory, or rely on the data storage device 708. In either case, the RAM memory and the flash memory may be packaged in a variety of ways, including in any of the embodiments described above.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit for providing an internal power supply signal responsive to receiving an external power supply signal, comprising:
   a current limiter receiving the external power supply signal, the current limiter being configured to be responsive to an first enable signal to limit the current of the external power supply signal used to provide the internal power supply signal;
   a voltage regulator receiving the external power supply signal, the voltage regulator being configured to be responsive to a second enable signal to regulate the voltage of the internal power supply signal; and
   a power level detector coupled to the current limiter and the voltage regulator, the power level detector being configured to receive the internal power supply signal and to compare a voltage of the internal power supply signal to a threshold voltage, the power level detector further being configured to provide the first enable signal to the current limiter when the voltage of the internal power supply signal is less than the threshold voltage, and to provide the second enable signal to the voltage regulator when the voltage of the internal power supply signal is greater than the threshold voltage.

2. The circuit of claim 1 wherein the voltage regulator comprises at least a first voltage regulator circuit configured to regulate a rate at which a voltage level of the internal power supply signal changes to a first rate when the voltage level of the internal power supply signal is less than a threshold level, and at least a second voltage regulator configured to regulate a rate at which a voltage level of the internal power supply signal changes to a second rate that is different from the first rate when the voltage level of the internal power supply signal is greater than the threshold level.

3. The circuit of claim 1 wherein the voltage regulator is configured to ramp up the internal power supply signal towards a reference voltage level that is less than a voltage level of the external power supply signal.

4. The circuit of claim 3 wherein the reference voltage level is generated by a reference voltage circuit that includes a comparator.

5. The multi-device package of claim 1 wherein the first threshold voltage is the minimum voltage level for a power-up operation of the first memory device, and the second threshold voltage is the minimum voltage level for a power-up operation of the second memory device.

6. A multi-device package, comprising:
   at least a first memory device having a first regulator device coupled to receive an external supply voltage and configured to generate a first internal supply voltage from the external supply voltage, the first internal supply voltage being used to provide power to the first memory device, the first regulator device comprising:
      a first current limiter receiving the external supply voltage, the first current limiter being configured to be responsive to an first enable signal to limit the current of the external supply voltage used to provide the first internal supply voltage;
      a first voltage regulator receiving the external supply voltage, the first voltage regulator being configured to be responsive to a second enable signal to regulate the voltage of the first internal supply voltage; and
      a first power level detector coupled to the first current limiter and the first voltage regulator, the first power level detector being configured to receive the first internal supply voltage and to compare the magnitude of the first internal supply voltage to a first threshold voltage, the first power level detector further being configured to provide the first enable signal to the first current limiter when the magnitude of the first internal supply voltage is less than the first threshold voltage, and to provide the second enable signal to the first voltage regulator when the magnitude of the first internal supply voltage is greater than the first threshold voltage; and
   at least a second memory device having a second regulator device coupled to receive the external supply voltage and configured to generate a second internal supply voltage from the external supply voltage, the second internal supply voltage being used to provide power to the second memory device, the second regulator device comprising:
  a second current limiter receiving the external supply voltage, the second current limiter being configured to be responsive to a third enable signal to limit the current of the external supply voltage used to provide the second internal supply voltage;
  a second voltage regulator receiving the external supply voltage, the second voltage regulator being configured to be responsive to a fourth enable signal to regulate the voltage of the second internal supply voltage; and
  a second power level detector coupled to the second current limiter and the second voltage regulator, the second power level detector being configured to receive the second internal supply voltage and to compare the magnitude of the second internal supply voltage to a second threshold voltage, the second power level detector further being configured to provide the third enable signal to the second current limiter when the magnitude of the second internal supply voltage is less than the second threshold voltage, and to provide the fourth enable signal to the second voltage regulator when the magnitude of the second internal supply voltage is greater than the second threshold voltage.

7. The multi-device package of claim 6 further comprising a first comparator circuit coupled to the first current limiter circuit and a second comparator circuit coupled to the second current limiter, each of the first and second comparator circuits configured to receive a respective one of the first and second internal supply voltages, and to enable the respective one of the first and second current limiters when the respective first and second internal supply voltage is less than a threshold voltage level.

8. The multi-device package of claim 6 wherein the at least second memory device completes a power up operation at a time instance different than when the at least first memory chip completes a power up operation.

9. The multi-device package of claim 6 wherein each of the first and second internal supply voltages is ramped up towards a respective reference voltage that is less than the external supply voltage.

10. The multi-device package of claim 6 wherein each of the at least first and second memory devices further comprises a strap pad configured to receive a select signal, wherein each of the memory devices is further configured in accordance with the select data it respectively receives.

11. The multi-device package of claim 10 wherein each of the memory devices is configured such that the ramp-up rate of that memory device is configured in response to a received select signal.

12. The multi-device package of claim 11 wherein each of the first and second current limiters comprise a plurality of transistors selectively configurable to increase the magnitude of the respective first and second internal supply voltage responsive to the received select signal.

13. A system comprising:
  processor circuitry; and
  at least one memory package coupled to the processor circuit, the at least one memory package including a plurality of memory devices and being coupled to receive an external power supply signal, wherein each memory device comprises:
    a current limiter receiving the external power supply signal, the current limiter being configured to be responsive to an first enable signal to limit the current of the external power supply signal used to provide an internal power supply signal;
    a voltage regulator receiving the external power supply signal, the voltage regulator being configured to be responsive to a second enable signal to regulate the voltage of the internal power supply signal; and
    a power level detector coupled to the current limiter and the voltage regulator, the power level detector being configured to receive the internal power supply signal and to compare a voltage of the internal power supply signal to a threshold voltage, the power level detector further being configured to provide the first enable signal to the current limiter when the voltage of the internal power supply signal is less than the threshold voltage, and to provide the second enable signal to the voltage regulator when the voltage of the internal power supply signal is greater than the threshold voltage.

14. The system of claim 13 wherein the current limiter of each memory device comprises a plurality of transistors being selectively enabled to generate the internal power supply signal at a ramp up rate.

15. The system of claim 13 wherein each of the memory devices is configured to sequentially power-up at different times responsive to receiving a respective select signal from the processor circuitry.

16. The system of claim 13 wherein the at least one memory device comprises at least one flash memory device.

17. A method of powering-up an internal power signal, comprising:
  providing the internal power signal from an external power signal;
  comparing a voltage of the internal power signal to a threshold;
  limiting the current of the external power signal used to provide the internal power signal when the comparison indicates that the voltage of the internal power signal is less than the threshold; and
  regulating the voltage of the internal power signal when the comparison indicates that the voltage of the internal power signal is greater than the threshold and initiating device operations responsive to the voltage of the internal power signal reaching the threshold value.

* * * * *